(12) United States Patent
Chang et al.

(10) Patent No.: US 11,532,752 B2
(45) Date of Patent: Dec. 20, 2022

(54) NON-VOLATILE MEMORY DEVICE WITH REDUCED AREA

(71) Applicant: TAIWAN SEMICONDUCTOR MANUFACTURING COMPANY LTD., Hsinchu (TW)

(72) Inventors: Meng-Sheng Chang, Hsinchu County (TW); Chia-En Huang, Hsinchu County (TW); Yao-Jen Yang, Hsinchu County (TW); Yih Wang, Hsinchu (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 4 days.

(21) Appl. No.: 17/232,639

(22) Filed: Apr. 16, 2021

(65) Prior Publication Data

US 2021/0257495 A1 Aug. 19, 2021

Related U.S. Application Data

(63) Continuation of application No. 16/573,803, filed on Sep. 17, 2019, now Pat. No. 11,018,260.

(51) Int. Cl.
*H01L 29/78* (2006.01)
*H01L 29/423* (2006.01)
*H01L 21/8234* (2006.01)
*H01L 21/8239* (2006.01)
*G06F 12/14* (2006.01)

(52) U.S. Cl.
CPC ...... *H01L 29/7851* (2013.01); *H01L 21/8239* (2013.01); *H01L 21/823431* (2013.01); *H01L 29/42316* (2013.01); *G06F 12/1433* (2013.01)

(58) Field of Classification Search
CPC ..... H01L 21/823431; H01L 21/823437; H01L 21/82345; H01L 21/823821; H01L 21/823828; H01L 21/8239; H01L 27/0886; H01L 27/1052; H01L 27/108; H01L 27/112; H01L 27/115; H01L 29/41; H01L 29/41791; H01L 29/42316; H01L 29/42372; H01L 29/772; H01L 29/7851; H01L 29/792; H01L 29/785; G06F 12/1433
See application file for complete search history.

(56) References Cited

U.S. PATENT DOCUMENTS

2016/0211251 A1* 7/2016 Liaw .................. H01L 27/0207

* cited by examiner

*Primary Examiner* — Cheung Lee
(74) *Attorney, Agent, or Firm* — WPAT Law; Anthony King (57) ABSTRACT

A memory device includes a substrate, a semiconductor fin over the substrate and extending in a first direction, and a first gate electrode and a second gate electrode over the substrate and extending in a second direction. The semiconductor fin extends through the second gate electrode and terminates on the first gate electrode at one end. The memory device further includes a first conductive via over and electrically coupled to the first gate electrode. The one end of the semiconductor fin is surrounded by the first gate electrode.

20 Claims, 10 Drawing Sheets

NON-VOLATILE MEMORY DEVICE WITH REDUCED AREA

PRIORITY CLAIM AND CROSS-REFERENCE

This application is a continuation application claiming priority to U.S. non-provisional application Ser. No. 16/573,803 filed Sep. 17, 2019, the disclosure of which is hereby incorporated by reference in its entirety.

BACKGROUND

Non-volatile memory devices are used to store data in modern integrated circuits and find widespread applications in a variety of electronic devices. One-time-programmable (OTP) memory is one type of non-volatile memory that can be programmed once to store information that is not to be subsequently changed. Modern memory manufacturers have adopted metal-oxide-semiconductor (MOS) techniques for implementing the OTP memory, which provide high integration with other logic circuits to be fabricated in the same chip. As technologies evolve, the manufacturing of semiconductor devices become more complicated in view of their smaller dimensions and increasing numbers of circuits providing greater functionality. After years of development of existing OTP memory techniques, there are still aspects that are not satisfactory, such as minimization of power requirement and footprint. Therefore, it is desirable to fabricate a high-performing non-volatile memory, such as the OTP memory, with a more compact structure.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

In the following detailed description, numerous specific details are set forth in order to provide a thorough understanding of the present disclosure. However, it should be understood by those skilled in the art that the present disclosure may be practiced without these specific details. In other instances, well-known methods, procedures, components and circuits are not described in detail so as not to obscure the present disclosure.

Further, the present disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the deviation normally found in the respective testing measurements. Also, as used herein, the terms "about," "substantial" or "substantially" generally mean within 10%, 5%, 1% or 0.5% of a given value or range. Alternatively, the terms "about," "substantial" or "substantially" mean within an acceptable standard error of the mean when considered by one of ordinary skill in the art. Other than in the operating/working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the terms "about," "substantial" or "substantially." Accordingly, unless indicated to the contrary, the numerical parameters set forth in the present disclosure and attached claims are approximations that can vary as desired. At the very least, each numerical parameter should at least be construed in light of the number of reported significant digits and by applying ordinary rounding techniques. Ranges can be expressed herein as from one endpoint to another endpoint or between two endpoints. All ranges disclosed herein are inclusive of the endpoints, unless specified otherwise.

The present disclosure discusses a structure and a forming method of a one-time programmable (OTP) non-volatile memory. The proposed OTP memory structure is directed to configuring a dummy Poly-on-OD-Edge (PODE) gate electrode as a functional programming transistor in a bit cell of the memory. In other words, the PODE gate electrode serves dual functions of protecting the functional transistors near the edges of active areas while acting as a programming transistor for the respective bit cell. Therefore, the bit cell area of the proposed memory array is significantly reduced due to the reduction of one programming transistor while the performance of functional transistors near the PODE gate electrode is maintained.

Figure 1:
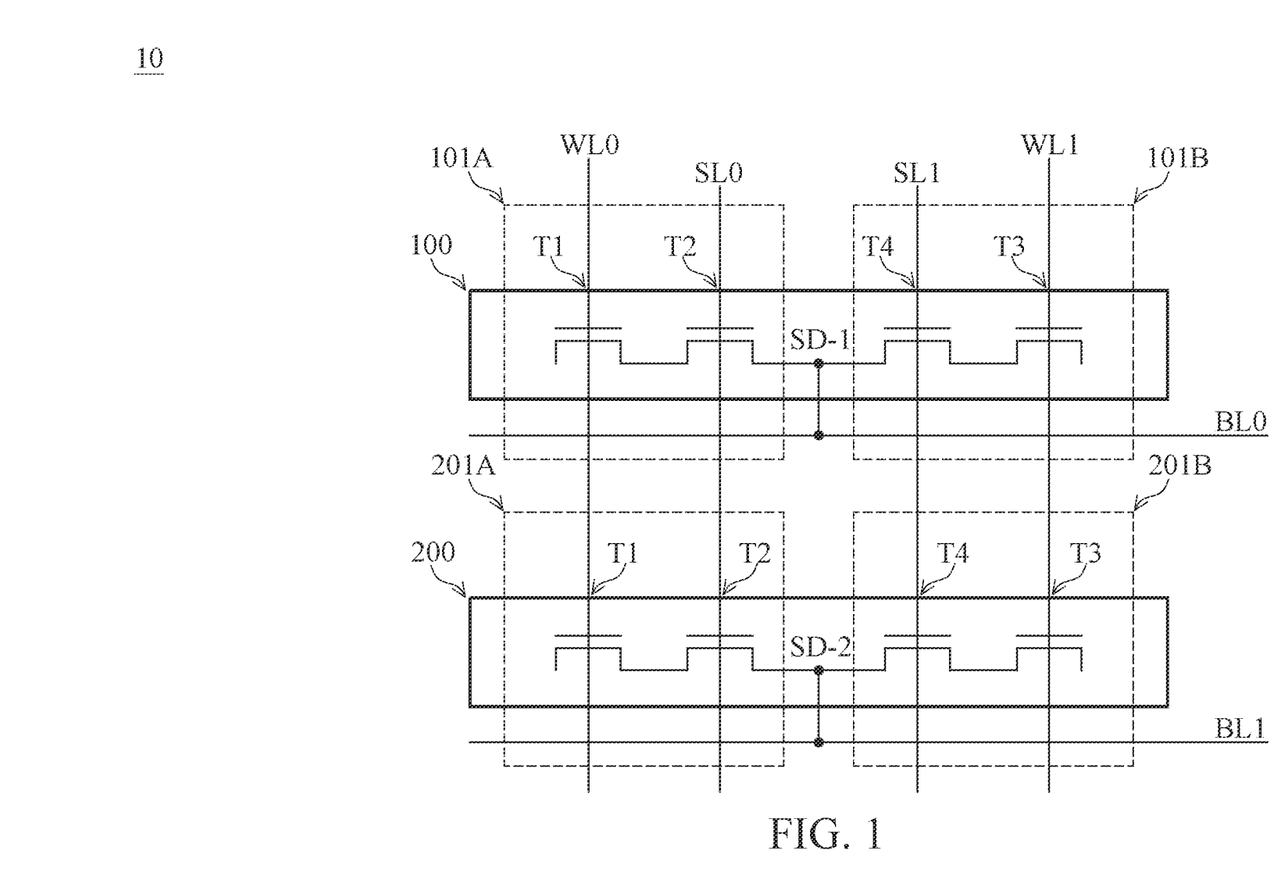
FIG. 1 is a schematic circuit diagram of a memory array, in accordance with some embodiments of the present disclosure.

FIG. 1 is a schematic diagram illustrating a memory array 10, in accordance with some embodiments. The memory array 10 is a type of non-volatile memory, such as an OTP memory; however, other types of non-volatile memory are also possible. The memory array 10 is constructed by an array of bit cells arranged in rows and columns. In the depicted embodiments, the memory array 10 includes two rows and two columns of bit cells. A first row 100 includes a first bit cell 101A and a second bit cell 101B, and a second row 200 includes a first bit cell 201A and a second bit cell 201B. Each bit cell is configured to store a logic state '0' or '1' to represent a data bit.

The bit cells of the first column share a program word line, or, more simply, a word line, WL0, and a read word line, also referred to as a first source line, SL0. Likewise, the bit cells of the second column share a program word line, or, simply, a word line, WL1, and a read word line, also referred to as a second source line, SL1. The bit cells 101A and 101B of the first row share a bit line BL0, and the bit cells 201A and 201B of the second row share a bit line BL1.

In some embodiments, the bit cells of the memory array 10 are constructed by a two-transistor (2T) cell. In other words, each of the bit cells 101A, 101B, 201A and 201B includes at least two transistors. However, each of the bit cells 101A, 101B, 201A and 201B may be formed by less than two transistors in other embodiments. In the depicted embodiment, the first bit cell 101A includes a program transistor T1 and a read transistor T2, and the second bit cell 101B is formed of a program transistor T3 and a read transistor T4. The program word line WL0 is electrically coupled to gate electrodes of the program transistors T1 of the bit cells in the first column, and the source line SL0 is electrically coupled to gate electrodes of the read transistors T2 of the bit cells in the first column. Likewise, the program word line WL1 is electrically coupled to gate electrodes of the program transistors T3 of the bit cells in the second column, and the source line SL1 is electrically coupled to gate electrodes of the read transistors T4 of the bit cells in the second column.

The bit cells 101A and 101B adjoin each other and share a source/drain region SD-1 through which the bit cells 101A and 101B are electrically coupled to the bit line BL0. Likewise, the bit cells 201A and 201B adjoin each other and share a source/drain region SD-2 through which the bit cells 201A and 201B are electrically coupled to the bit line BL1.

During a programming operation, a bit cell, e.g., the first bit cell 101A, is selected by row and column select signals to turn on the read transistor T2 of the first bit cell 101A. In an example of an N-type transistor, the row select signal is a positive voltage applied to the gate electrode of the read transistor T2 via the source line SL0 and a ground reference voltage is applied to the source/drain region SD-1 of the read transistor T2 via the bit line BL0. A program voltage is applied to the gate electrode of the program transistor T1 via the word line WL0. In some embodiments, the program voltage is higher than the voltage of the select signal, and may be between about 3 volts and about 7 volts, depending on the structure of the program transistor T1. The program voltage causes an electrical breakdown of the gate dielectric layer in the program transistor T1, causing the program transistor T1 to conduct an electrical current therethrough. In the programmed state of the program transistor T1, a conduction current between about tens of µA and about hundreds of µA may flow through the gate dielectric layer, in contrast to a negligible current level in the non-programmed state where the undamaged gate dielectric layer blocks electrical current from flowing through. Such programming mechanism changes the electrical insulating characteristic of the gate dielectric layer and makes the bit cell a one-time programmable memory device since the damaged gate dielectric layer cannot be returned to its original state after it is programmed.

During a read operation, for an N-type transistor, a row select signal is applied through the source line, e.g., SL0, to the gate electrode of the read transistor T2 and a ground reference voltage is applied to the source/drain region SD-1 of the read transistor T2 via the bit line BL0. A read voltage is applied to the gate electrode of the program transistor T1 via the word line WL0. In some embodiments, the read voltage is substantially equal to the voltage of the select signal, and may be between about 0.5 volts and about 1.5 volts. The generated current is sent to a sense amplifier (not separately shown) to detect the logic state stored in the first bit cell 101A. A programmed bit cell and a non-programmed bit cell may represent logic '1' and logic '0', respectively, or vice versa, depending on the specification.

In some embodiments, other cell types having structures different from the 2T structure, e.g., a three-transistor (3T) cell type, can also be adopted in the memory array 10. The transistor used in the bit cells may be a metal-oxide semiconductor (MOS) field-effect transistor (MOSFET). In some embodiments, the transistors are fin-type FET (FinFET), planar MOSFET, or other types of transistor devices. In some embodiments, FinFET devices are used to implement the memory array 10 due to their performance advantages, such as lower power consumption, less circuit noise and higher gain, as compared to planar transistors.

Figure 2:
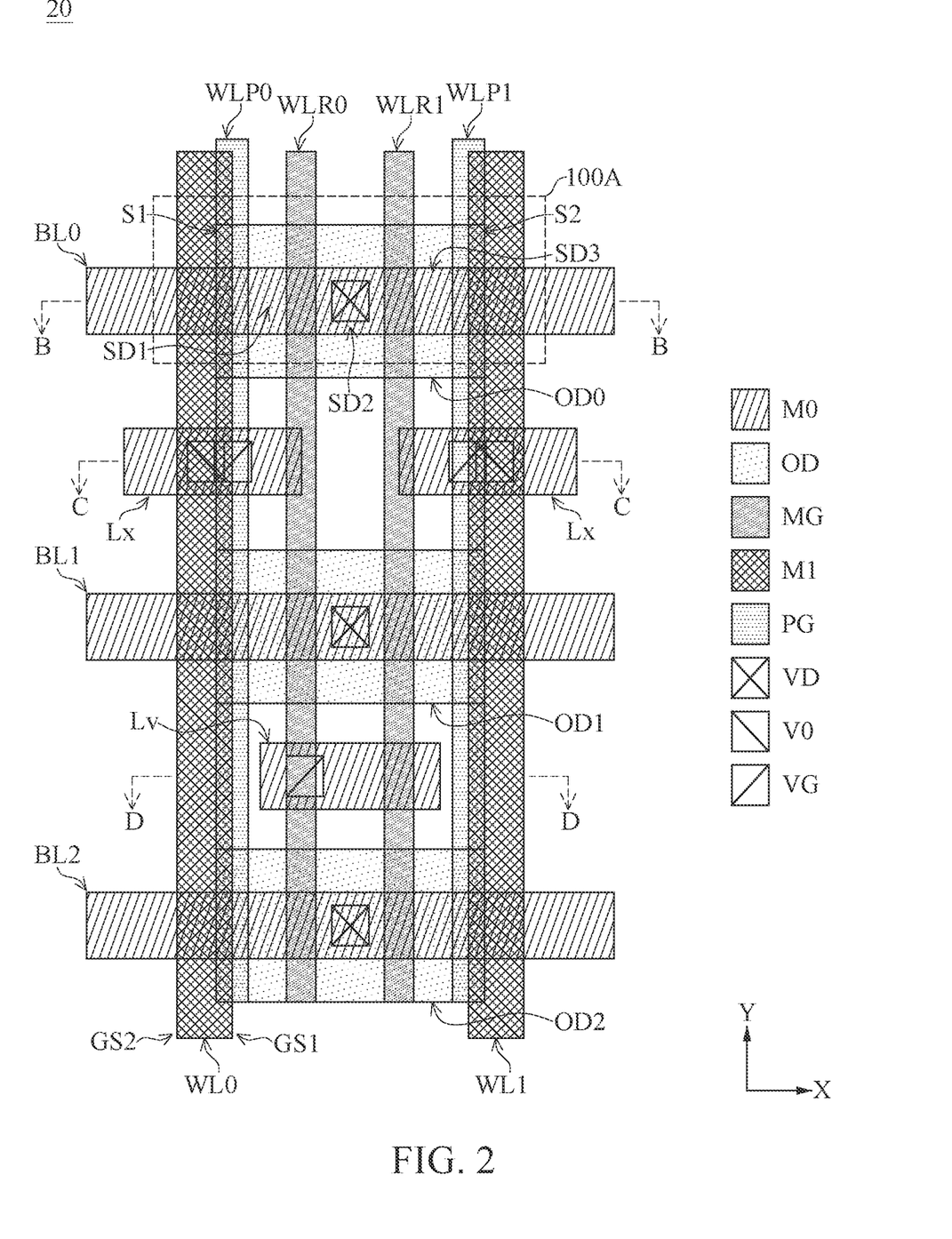
FIG. 2 is a schematic layout for the memory array of FIG. 1, in accordance with some embodiments of the present disclosure.

FIG. 2 is a schematic layout 20 for the memory array of FIG. 1, in accordance with some embodiments of the present disclosure. Selected features of the memory array in FIG. 1, particularly those directly relevant to the features in FIG. 1, are shown for clarity. The layout 20 is formed of overlaid layers in which features in different layers are illustrated with different hatching patterns. FIG. 2 illustrates a bit cell array of three rows and two columns, in which each bit cell is constructed at least by a program transistor and read transistor. As discussed previously, the program transistor and the read transistor can be fabricated by any type of transistors. Perspective and cross-sectional details of the transistors T1 through T4 are provided in subsequent paragraphs with reference to FIGS. 3A to 3D.

The layout 20 includes three active areas OD0, OD1, and OD2 extending along the X-axis, and four gate electrodes WLP0, WLR0, WLP1 and WLR1 extending along the Y-axis. The gate electrodes WLP0, WLR0, WLP1 and WLR1 extend over and across the active areas OD0, OD1 and OD2. In some embodiments, the gate electrodes WLP0 and WLP1 are labeled in FIG. 2 as program gates (PG) and the gate electrodes WLR0 and WLR1 are referred to as metal gates (MG). The active area OD0 is configured to form the program transistor T1 and read transistor T2 of the first bit cell 101A in FIG. 1 in conjunction with the gate electrodes WLP0 and WLR0, respectively. Likewise, the active area OD0 is configured to form the program transistor T3 and read transistor T4 of the second bit cell 101B in FIG. 1 in conjunction with the gate electrodes WLP1 and WLR1, respectively. Further, the active area OD1 (or OD2) is configured to form the respective program transistor and read transistor of the first bit cell in the second (or third) row in conjunction with the gate electrodes WLP0 and WLR0, respectively. Likewise, the active area. OD1 (or OD2) is configured to form the respective program transistor and read transistor of the second bit cell in the second (or third) row in conjunction with the gate electrodes WLP1 and WLR1, respectively.

In some embodiments, source/drain regions are formed in the active areas OD0, OD1 and OD2 between the gate electrodes WLP0, WLR0, WLP1 and WLR1. Taking the first row as an example, a first source/drain region SD1 of the active area OD0 between the gate electrodes WLP0 and WLR0 is shared by the program transistor T1 and the read transistor T2, a second source/drain region SD2 of the active area OD0 between the gate electrodes WLR0 and WLR1 is shared by the read transistors T2 and T3, and a third source/drain region SD3 of the active area OD0 between the gate electrodes WLR1 and WLP1 is shared by the program transistor T3 and the read transistor T4. Each of the active areas OD0, OD1 and OD2 extends along the X-axis and has two ends resting on the program transistors T1 and T3. In some embodiments, each of the active areas OD0, OD1 and OD2 has two lateral sides S1 and S2 parallel to the direction in which the gate electrodes WLP0 and WLP1 extend and resting on the program transistors T1 and T3. In some embodiments, each of the gate electrodes WLP0 and WLP1 has a first lateral side GS1 crossing the active area OD0, OD1, or OD2, and a second lateral side GS2 faces the lateral side S1 or S2 of the active area OD0, OD1, or OD2.

Conductive lines, such as bit lines BL0, BL1 and BL2, are formed in a first overlying layer M0 above the aforesaid active areas and gate electrodes. The bit lines BL0, BL1 and BL2 extend along the X-axis and are substantially parallel to the active areas OD0, OD1 and OD2. In some embodiments, the bit lines BL0, BL1 and BL2 extend over different bit cells of the same row and cross the gate electrodes WLP0, WLR0, WLP1 and WLR1. Conductive vias VD are formed in another overlying layer to electrically couple the second source/drain region SD2 in each row to the respective bit lines BL0, BL1 and BL2.

Conductive lines, such as word lines WL0 and WL1, are formed above the aforesaid active areas and the gate electrodes in an overlying layer M1 different from the layer M0. The word lines WL0 and WL1 extend along the Y-axis and are substantially parallel to the gate electrodes WLP0, WLR0, WLP1 and WLR1. In some embodiments, the bit lines BL0, BL1 and BL2 extend over different bit cells of the same column and cross different active areas OD0, OD1 and OD2. Conductive vias VG and V0 are formed to vertically couple the gate electrodes WLP0 and WLP1 of the program transistors T1 and T3 to the respective word lines WL0 and WL1. In some embodiments, another conductive line Lx is formed in the layer M0 to electrically couple the underlying conductive via VG to the overlying conductive via V0. The conductive line Lx may be between the adjacent bit lines BL0 and BL1 and may extend along the X-axis.

Source lines (such as SL0 and SL1 in FIG. 1, although not separately shown in FIG. 2) are formed in the layer M1 above the aforesaid active areas and the gate electrodes. In some embodiments, the source lines SL0 and SL1 are formed in a layer different from the layer M1. A conductive via VG is formed to electrically couple the gate electrode WLR0 of the read transistor T2 in the first column to the respective source line SL0 through a conductive line Lv in the layer M0. Likewise, a conductive via VG (not separately shown) is formed to electrically couple the gate electrode WLR1 of the read transistor T4 in the second column to the respective source line SL1. The conductive via VG for the gate electrode WLR1 may be formed in the same layer as the conductive vias VG coupled to the gate electrode WLR0.

Figure 3A:
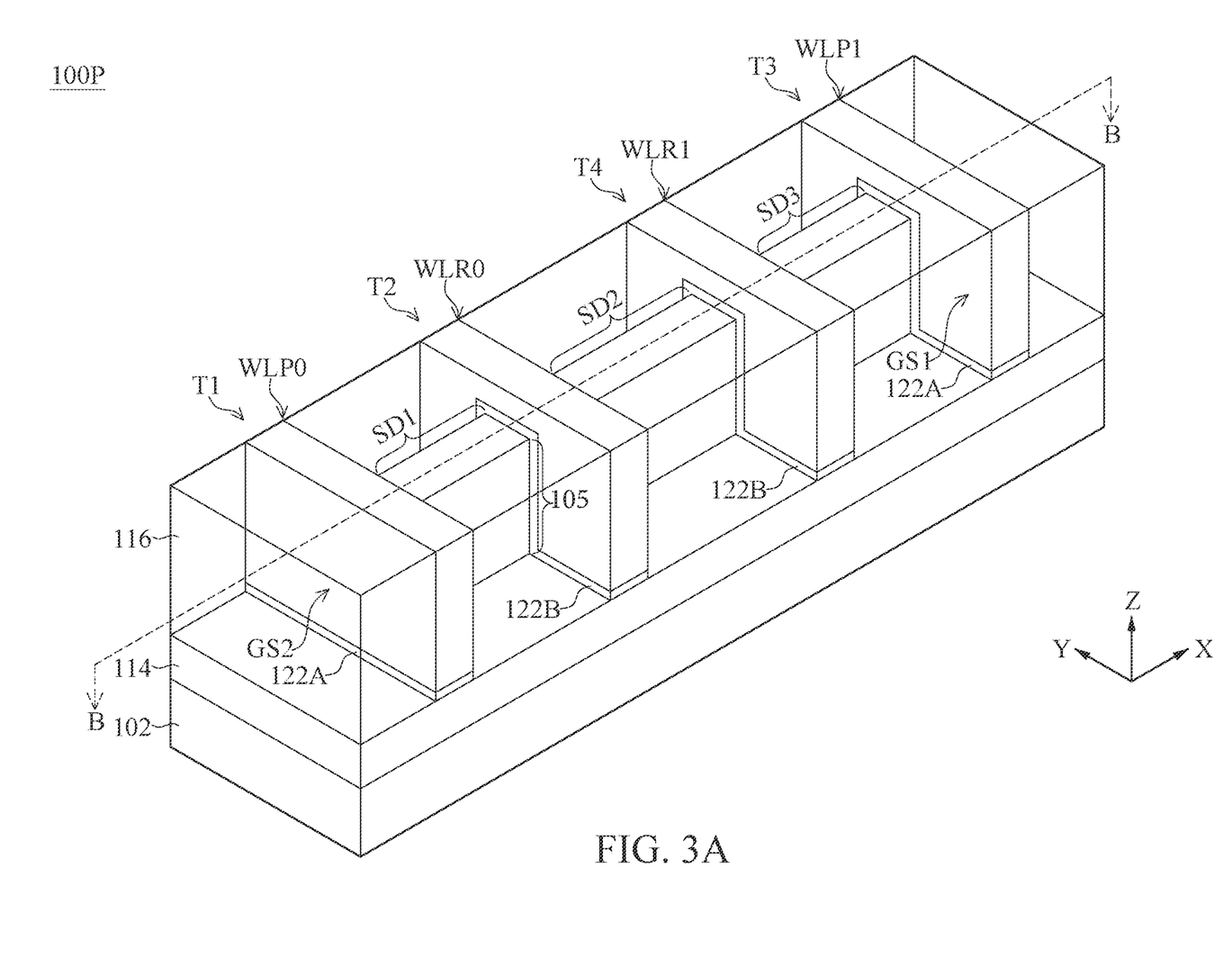
FIG. 3A is a perspective view of the memory array of FIG. 1, in accordance with some embodiments of the present disclosure.

In the present embodiment, FinFET devices are adopted to implement the transistors T1 through T4 of the bit cell in FIGS. 1 and 2. FIG. 3A shows a simplified perspective view 100P of a dashed region 100A in the first row 100 of the memory array 10. Four FinFET devices T1 through T4 are shown in FIG. 3A and correspond to the transistors in the first row 100 of FIG. 1. For the sake of clarity, only selected features of the FinFET devices T1 through T4 are illustrated in FIG. 3A, and more details of the FinFET devices T1 through T4 are provided in FIGS. 3B to 3D.

In the present disclosure, the gate electrodes WLP0 and WLP1 are of a PODE type. A PODE is generally used as a dummy gate electrode in existing techniques for implementing FinFET circuits and, unlike a normal transistor, does not provide any functions, but may aid in enhancing the performance of the non-PODE gate electrodes, such as the gate electrodes WLR0 and WLR1. In the present disclosure, the PODE-type gate electrodes WLP0 and WLP1 are used not only for the original purpose of the PODE but also function as program transistors for the OTP memory, and thus are not deemed as merely dummy gate electrodes.

Referring to FIGS. 2 and 3A, the perspective view 100P includes a substrate 102, a fin 105 over the substrate 102, and four gate electrodes WLP0, WLR0, WLR1 and WLP1. The substrate 102 may be a semiconductor substrate, such as a bulk silicon substrate, a semiconductor-on-insulator (SOI) substrate, or the like, and may be doped (e.g., with a p-type or an n-type dopant) or undoped. Other substrates, such as a multi-layered or gradient substrate, may also be used as the substrate 102. In some embodiments, the semiconductor material of the substrate 102 may include germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof.

The fin 105 may be formed by patterning the substrate 102. An exemplary patterning operation may include photolithography and etching operations to etch the substrate 102 and form a base portion and parallel strips protruding from the base portion. Subsequently, isolation regions 114 are deposited over the base portion of the substrate 102 between the adjacent strips. The isolation regions 114 may include insulating materials, such as a dielectric material, e.g., silicon oxide, silicon nitride, silicon oxynitride, a combination thereof, or the like. The isolation regions 114 may be formed by physical vapor deposition (PVD), chemical vapor deposition (CVD), atomic layer deposition (ALD), high-density plasma chemical vapor deposition (HDP-CVD), flowable CVD (FCVD), a combination thereof, or the like. The isolation regions 114 are planarized and recessed to be below the strips. In some embodiments, the recessed isolation regions 114 are referred to as shallow trench isolation (STI) regions. The upper portion of the semiconductor strip protruding from between neighboring isolation regions 114 is referred to as the fin 105, as shown in FIG. 3A. In some embodiments, the fin 105 is also referred to as a semiconductor fin.

In some embodiments, well regions (not shown) may also be formed in the fin 105. The fin 105 may include p-type wells (p-wells), n-type wells (n-wells), or both. In some embodiments, p-type dopants are implanted into the fin 105 to form the p-wells. The p-type dopants may be boron, $BF_2$, or the like. In some embodiments, n-type dopants are implanted into the fin 105 to form the n-wells. The n-type dopants may be phosphorus, arsenic, or the like. In some embodiments, an annealing operation may be performed on the fin 105 to activate the implanted p-type and n-type dopants to improve the well performance.

The gate electrodes WLP0, WLR0, WLR0 and WLR1 are formed over the fin 105. Each of the transistors T1 through T4 further includes a gate dielectric layer 122 (e.g., 122A and 122B) between the aforesaid gate electrodes and the fin 105. The gate dielectric layers 122 are disposed on sidewalk and over an upper surface of the fin 105. In addition, source/drain regions SD1, SD2 and SD3 are formed in the fin 105 between the gate electrodes WLP0, WLR0, WLP1 and WLR1. In some embodiments, epitaxial source/drain regions are formed in place of the material of the fin 105. In some embodiments, the epitaxial source/drain regions may be grown to have greater widths than the original width of the fin 105 along the Y-axis. The channel region (not shown) of each of the transistors T1 through T4 is established within the fin 105 under the gate dielectric layers 122 between the adjacent gate electrodes WLP0, WLR0, WLR1 and WLP1.

The first row 100 further includes a dielectric layer 116 over the isolation regions 114 and surrounding the gate electrodes WLP0, WLR0, WLR1 and WLP1 and the fin 105. The dielectric layer may be referred to as an inter-layer dielectric (ILD) layer. The ILD layer 116 may fill the spaces between the fin 105 and the gate electrodes WLP0, WLR0, WLR1 and WLP1.

Figure 3B:
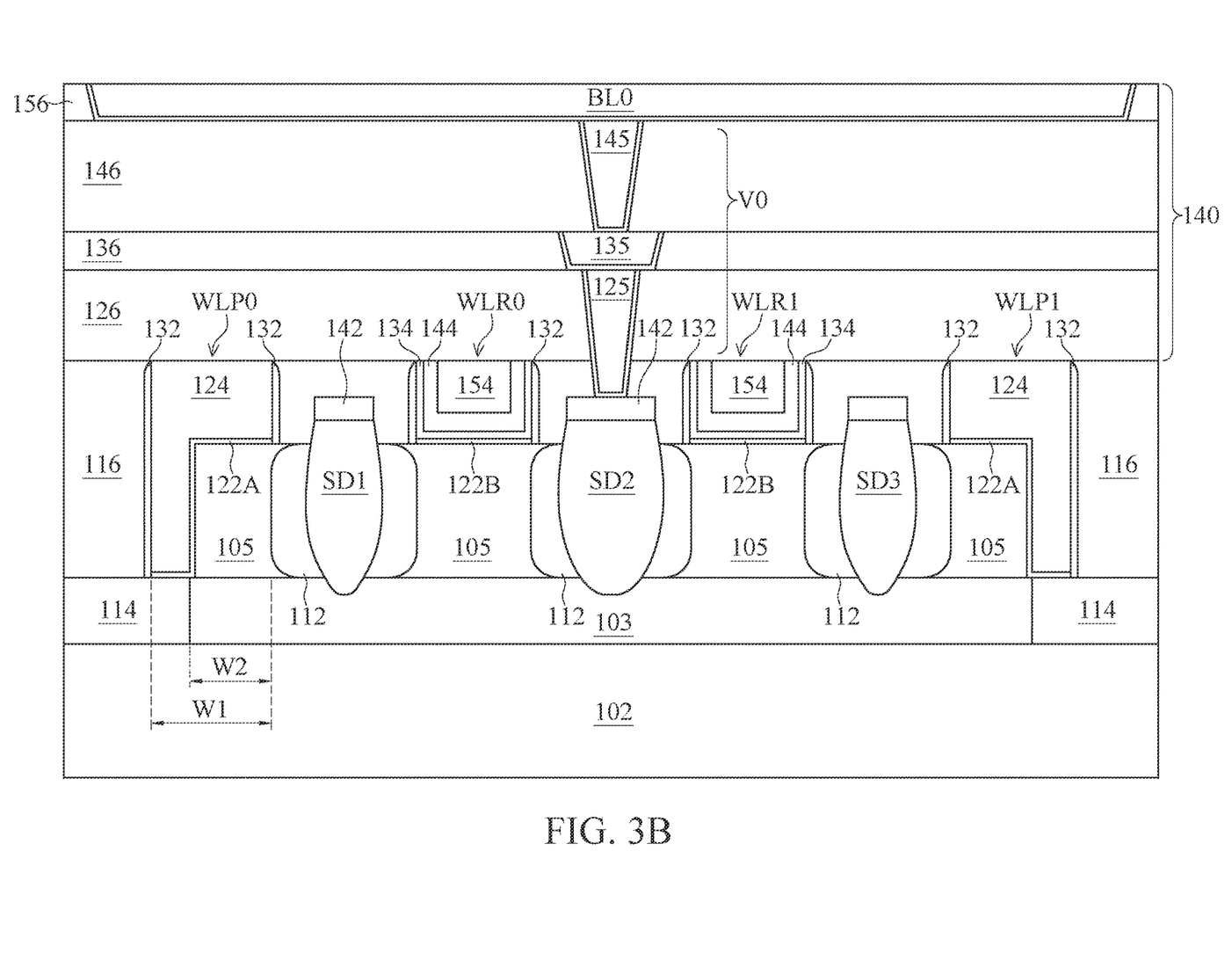
FIGS. 3B to 3D are schematic cross-sectional views of the memory array of FIG. 1, in accordance with some embodiments of the present disclosure.
Figure 3C:
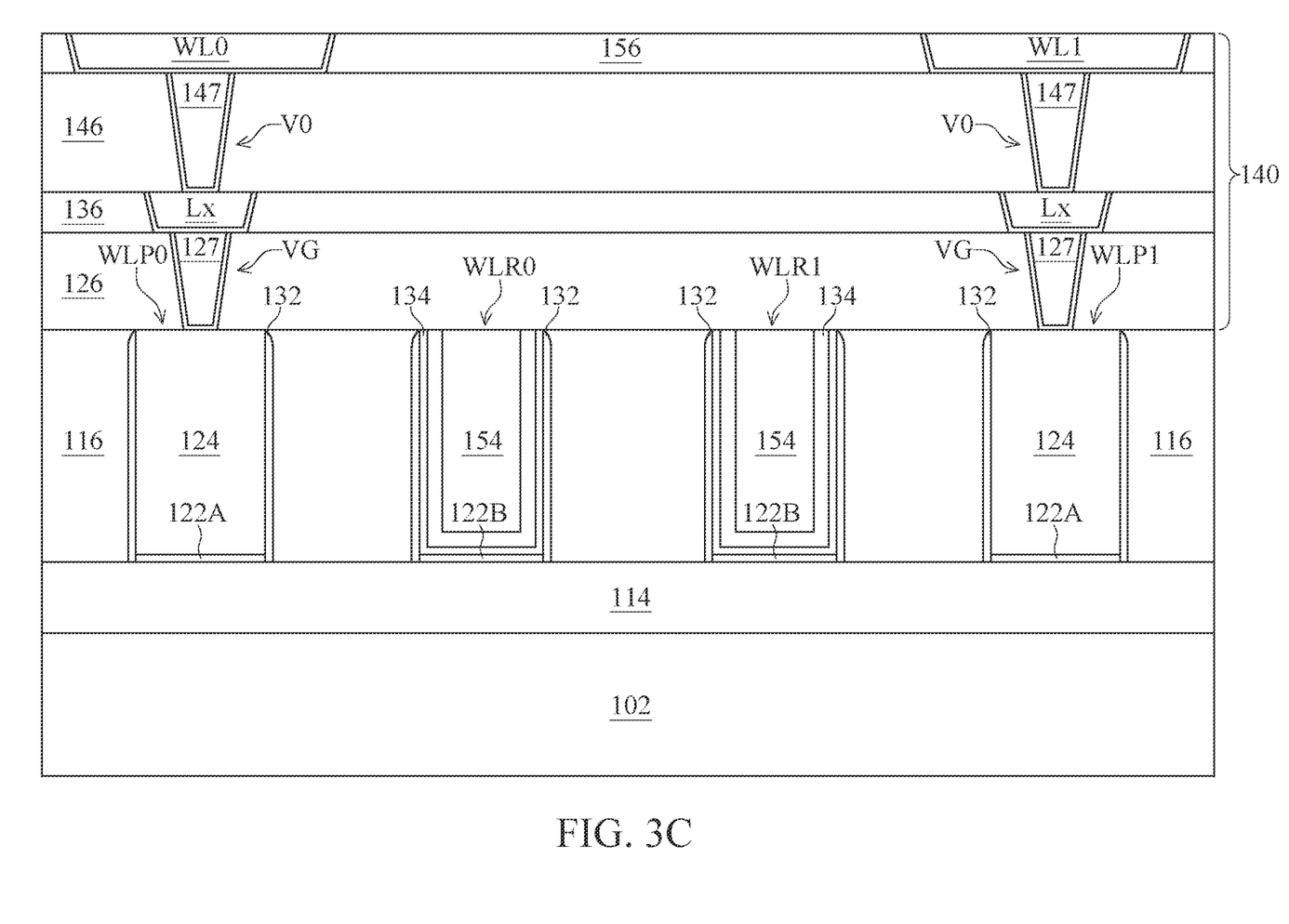
Figure 3D:
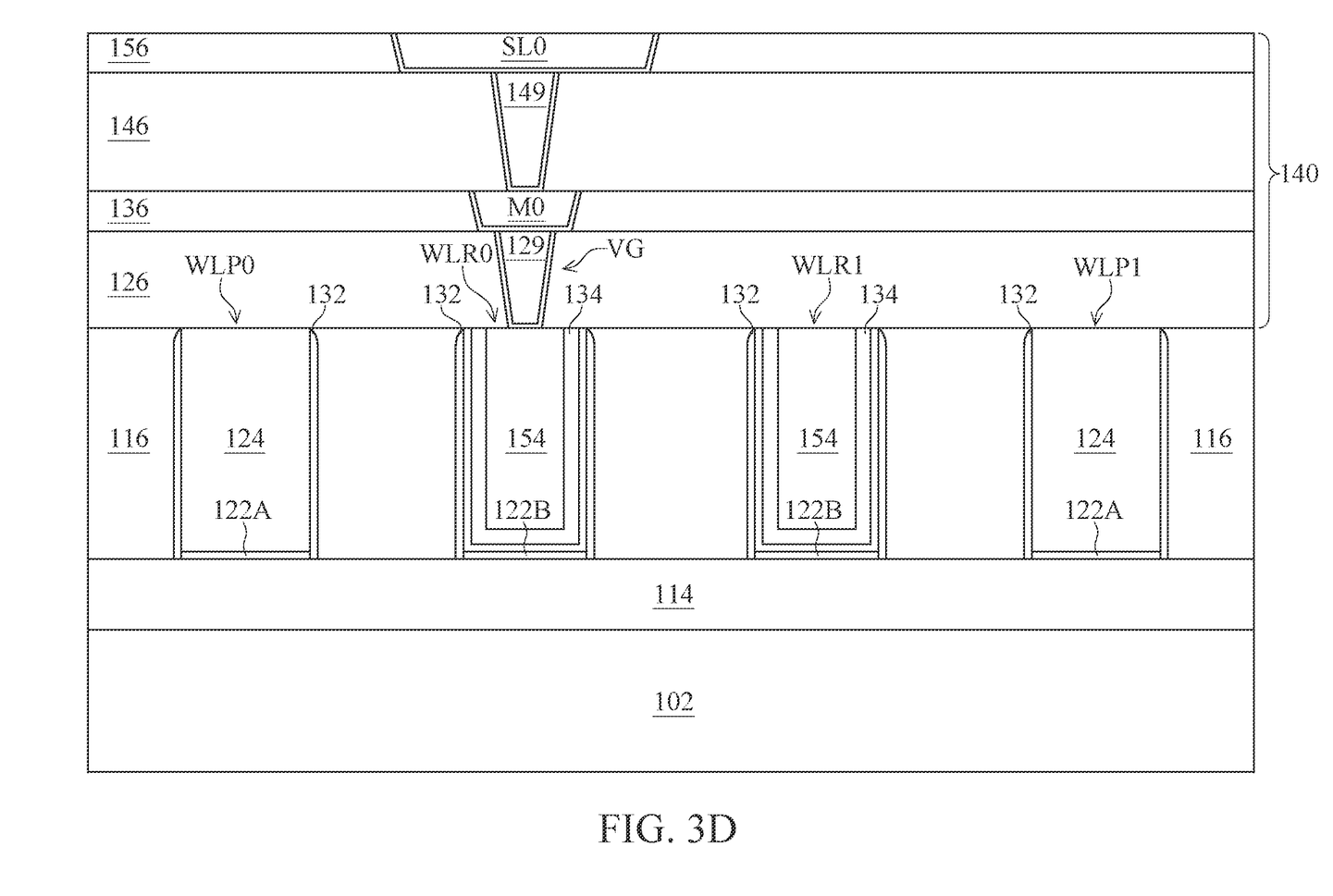

FIGS. 3B, 3C and 3D are schematic cross-sectional views of the memory array of the layout 20 along cross sections B-B, C-C and D-D, respectively, with reference to FIG. 3A, in accordance with some embodiments of the present disclosure. Cross section B-B is taken along the bit line BL0 of the first row 100. Cross section C-C is taken in a direction along the conductive line Lx. Cross section D-D is taken along the conductive line Lv.

Referring to FIGS. 2, 3A and 3B, the fin 105 is disposed over the substrate 102. As discussed previously, the fin 105 is formed by etching a bulk material of the substrate 102 into parallel strips, followed by deposition of the isolation region 114 to laterally surround a lower portion 103 of each of the parallel strips. The lower portion 103 of the substrate 102 connects to the fin 105 and is referred to as a protrusion of the substrate 102 throughout the present disclosure. The upper portions of the strips protruding from the isolation region 114 are regarded as the fins, including the fin 105. In some embodiments, the boundary of the fin 105 is defined by the isolation region 114. FIG. 3B shows the protrusion 103 that is below the fin 105 and surrounded by the isolation region 114. In some embodiments, the isolation region 114 has an upper surface serving as a boundary line between the protrusion 103 and the fin 105. Further, the fin 105 has a finite length that spans between the gate electrodes WLP0 and WLP1 of the program transistors T1 and T3. Two opposite sides of the fin 105, including two opposite sidewalls, are covered by the gate electrodes WLP0 and WLP1, respectively. In some embodiments, the fin 105 terminates on the gate electrodes WLP0 and WLP1 and portions of the bottom surfaces of the gate electrodes WLP0 and WLP1 overlap the isolation region 114.

The memory array 10 includes lightly doped source/drain (LDD) regions 112 in the fin 105 between the gate electrodes WLP0 and WLR0, between the gate electrodes WLR0 and WLR1, and between the gate electrodes WLR1 and WLP1. The LDD may be formed by ion implantation operations. P-type dopants, such as boron or $BF_2$, are implanted to form p-type LDD regions 112. N-type dopants, such as arsenic, phosphorus or the like, are implanted to form n-type LDD regions 112. During the implantation procedure, the gate electrodes may act as a mask to prevent (or at least reduce) dopants being implanted into the channel regions of the fin 105.

The source/drain region SD1 is between the gate electrodes WLP0 and WLR0, the source/drain region SD2 is between the gate electrodes WLR0 and WLR1, and the source/drain region SD3 is between the gate electrodes WLR1 and WLP1. In some embodiments, the source/drain regions SD1, SD2 and SD3 are doped regions formed in the fin 105 by an ion implantation operation, or the source/drain regions SD1, SD2 and SD3 may be formed as epitaxially grown regions in place of the material of the fin 105 by etching trenches in the fin 105 and performing deposition operations using, e.g., metal-organic CVD (MOCVD), molecular beam epitaxy (MBE), liquid phase epitaxy (LPE), vapor phase epitaxy (VPE), selective epitaxial growth (SEG), a combination thereof, or the like. In some embodiments, the epitaxial source/drain regions SD1, SD2, and SD3 may include SiGe, SiGeB, Ge, GeSn, or the like. In some embodiments, surfaces of the source/drain regions SD1, SD2 and SD3 may be raised from the upper surface of the fin 105 and may include facets.

In some embodiments, doped regions 142 are formed over the respective source/drain regions SD1, SD2, and SD3. The doped regions 142 have a doping concentration greater than those of the underlying source/drain regions SD1, SD2, and SD3 in order to reduce resistance. The doped regions 142 may cover the entire upper surfaces of the respective source/drain regions SD1, SD2, and SD3. In some embodiments, the doped regions 142 have a doping concentration between about 5E17 atoms/cm$^3$ and about 1E19 atoms/cm$^3$. In some embodiments, the source/drain regions SD1 and SD3 are not electrically coupled to the overlying layers through a conductive via, while the source/drain region SD2 is coupled to a conductive via 125, and the doped region 142 may be omitted from the source/drain regions SD1 and SD3. In some embodiments, the ILD layer 116 covers an entirety of the source/drain regions SD1 and SD3 or the doped regions 142 on the source/drain regions SD1 and SD3.

Gate dielectric layers 122 are formed between the fin 105 and the gate electrodes WLP0, WLR0, WLP1, and WLR1. For example, gate dielectric layers 122A are formed between the fin 105 and the gate electrodes WLP0 and WLP1 of the program transistors T1 and T3, and gate dielectric layers 122B are formed between the fin 105 and the gate electrodes WLR0 and WLR1 of the read transistors T2 and T4. In some embodiments, the gate dielectric layers 122A and 122B are formed of the same materials, such as silicon oxide. In some embodiments, the gate dielectric layers 122A and 122B may have different thicknesses. For example, a thinner gate dielectric layer 122A may reduce the required voltage and current for the programming operation. A thickness ratio of the gate dielectric layer 122A to the gate dielectric layer 122B may be between about 70% and 100%, or between about 80% and 90%. In some embodiments, a portion of the gate dielectric layer 122A extends along a sidewall of the fin 105 and reaches the isolation region 114. In some embodiments, a horizontal portion of the gate dielectric layer 122A extends over and contacts the isolation region 114. In some embodiments, the horizontal portion of the gate dielectric layer 122A extends along an upper surface of the isolation region 114 below the gate electrode WLP0 or WLP1.

In some embodiments, the fin 105 overlaps the gate electrode WLP0 by a width W2. A ratio of the width W2 to a width W1 of the gate electrode WLP0 is between about 5% and about 80%, and may be between about 10% and about 50%, or between about 25% and about 40%.

Gate spacers 132 are formed along sidewalls of the gate electrodes WLP0, WLP1, WLR0 and WLR1. The gate spacers 132 may be deposited along sidewalls of the aforesaid gate electrodes in a conformal manner. In some embodiments, the gate spacers 132 may comprise silicon nitride (SiN), silicon oxynitride (SiON), silicon oxycarbide (SiOC), silicon carbonitride (SiCN), silicon carboxynitride (SiOCN), combination thereof, or the like. In some embodiments, the gate spacers 132 have a multilayer structure. In some embodiments, the gate electrode WLP0 or WLP1 has an outer sidewall not crossed by the fin 105, and the gate spacer 132 is formed to cover the outer sidewall. In some embodiments, the outer sidewalls are covered by the isolation region 114.

The gate spacers 132 may be formed by depositing a blanket dielectric layer over the top surfaces and sidewalk of the gate electrodes WLP0, WLP1, WLR0 and WLR1 using PVD, CVD, ALD, a combination thereof, or the like. An etching operation is performed on the blanket dielectric layer, leaving the gate spacers 132 along sidewalls of the respective gate electrodes WLP0, WLP1, WLR0 and WLR1. The etch may be anisotropic, such as a dry etch or an RIE process using a directional ion bombardment to selectively etch the horizontal portions of the blanket dielectric layer while keeping the vertical portions substantially intact.

The ILD layer 116 may be deposited to fill the spaces between the fin 105 and the gate electrodes WLP0, WLP1, WLR0 and WLR1. The ILD layer 116 has an upper surface level with the gate electrodes WLP0, WLP1, WLR0 and WLR1, and gate spacers 132. In some embodiments, the ILD layer 116 is formed of a dielectric material such as silicon oxide, SiOC, $ZrO_2$, $HfO_2$, phospho-silicate glass (PSG), boro-silicate glass (BSG), boron-doped phospho-silicate glass (BPSG), undoped silicate glass (USG), low-k dielectric materials, extremely low-k dielectric materials, high-k dielectric materials, a combination thereof, or the like, and may be deposited by any suitable method, such as CVD, PECVD, spin coating, a combination thereof, or the like. In some embodiments, the ILD layer 116 faces and covers the entire second lateral sides GS2 of the gate electrodes WLP0 and WLP1.

The gate electrodes WLP0 and WLP1 may include conductive materials that are the same as or different from those of the gate electrodes WLR0 and WLR1. In some embodiments, the gate electrode WLR0 or WLR1 is a metal gate comprising a stack of metallic layers. The gate electrode WLP0 or WLP1 may be formed as a metal gate similar to the gate electrode WLR0 or WLR1. In some embodiments, the gate electrode WLP0 or WLP1 comprises a conductive layer 124 formed of polysilicon.

An exemplary metal gate of the gate electrode WLR0 or WLR1 may include a capping layer 134, a work function layer 144 and a filling layer 154. Initially, sacrificial gates comprising polysilicon are formed over the gate dielectric layers 122B. The ILD layer 116 is deposited between the fin 105 and the gate electrodes WLP0, WLP1, WLR0 and WLR1, and the sacrificial gates are then removed leaving an opening defined by the gate spacer 132.

In some embodiments, the capping layer 134 is formed in the opening over the gate dielectric layers 122B. The capping layer 134 may comprise titanium, titanium nitride, tantalum, tantalum nitride, other suitable materials, or combinations thereof. The capping layer 134 may formed by deposition techniques, such as PVD, CVD, ALD, or other suitable processes.

The work function layers 144 are formed over the capping layers 134. In some embodiments of an n-type FinFET device, the work function layer 144 comprises Ti, Ag, Al, TiAl, TiAlN, TiAlC, TaC, TaCN, TaSiN, TaAlC, Mn, Zr, a combination thereof, or the like, and may be formed along sidewalls and the bottom portion of the capping layer 134 using ALD, CVD, PVD, combinations thereof, or the like. In some embodiments of a p-type FinFET device, the work function layer 144 comprises TiN, WN, TaN, Ru, Co, a combination thereof, or the like, and may be formed along sidewalls and the bottom portion of the capping layer 134 using ALD, CVD, PVD, combinations thereof, or the like. After the forming of the work function layer 144, the opening is filled with a conductive layer 154. In some embodiments, the conductive layer 154 comprises Co, Ru, Al, Ag, Au, W, Ni, Ti, Cu, Mn, Pd, Re, Ir, Pt, Zr, alloys thereof, combinations thereof, or the like, and may be formed using ALD, CVD, PVD, plating, combinations thereof, or the like.

The memory array 10 may further include a redistribution layer (RDL) 140 over the transistors T1 through T4. The RDL 140 is configured to electrically interconnect the underlying features or couple the underlying features to external circuits. The RDL 140 generally includes stacked metallization layers, and each of the metallization layers includes conductive lines or vias in which the conductive lines are electrically coupled to an adjacent overlaying or underlying conductive line through intervening conductive vias.

The metal lines and metal vias are electrically insulated by dielectric materials, usually referred to as inter-metal dielectrics (IMD). In some embodiments, the conductive lines and vias may be formed of conductive materials, such as titanium, titanium nitride, tantalum, tantalum nitride, copper, silver, aluminum, gold, tungsten, combinations thereof, or the like. For example, in some embodiments, titanium is used as an adhesive layer and titanium nitride is used as a filling layer over the titanium layer. In some embodiments, the IMD comprises silicon oxide, silicon nitride, silicon oxynitride, silicon carbide, un-doped silicate glass (USG), fluorinated silicate glass (FSG), borophospho-silicate glass (BPSG), tetraethosiloxane (TEOS), spin-on glass (SOG), high-density plasma (HDP) oxide, plasma-enhanced TEOS (PETEOS), or the like.

As shown in FIG. 3B, the RDL 140 includes a first metallization layer formed of an IMD 126 and a conductive via 125, a second metallization layer formed of an IMD 136 and a conductive line 135, a third metallization layer formed of an IMD 146 and a conductive via 145, and a fourth metallization layer formed of an IMD 156 and the bit line BL0. The conductive vias 125 and 145 and the metal line 135 are collectively referred to as the conductive via VD in FIG. 2 and electrically couple the bit line BL0 to the source/drain region SD2.

Referring to FIGS. 2 and 3C, the cross-section C-C is taken along a hypothetic line between the active areas OD0 and OD1, and it can be seen that the gate electrodes WLP0, WLP1, WLR0 and WLR1 extend over the isolation region 114. In addition, the gate dielectric layers 122A and 122B are disposed over the isolation region 114 rather than over the fin 105 as shown in FIG. 3A. The ILD layer 116 covers opposite sidewalls of the gate spacers 132 of the gate electrodes WLP0, WLP1, WLR0 and WLR1. Deferring to FIGS. 2 and 3B, with regard to the RDL 140, the first metallization layer further includes two conductive vias 127

(i.e., the metal vias VG in FIG. 2) electrically coupled to the respective gate electrodes WLP0 and WLP1, the second metallization layer further includes two conductive lines Lx, the third metallization layer further includes two conductive vias 147 (i.e., the metal vias V0 in FIG. 2), and the fourth metallization layer further includes two conductive lines M0, i.e., WL0 and WL1. A conductive path constructed by the conductive via 127, conductive line Lx and conductive via 147 electrically couples the word line WL0 or WL1 in FIG. 2 to the gate electrodes WLP0 or WLP1, respectively.

Referring to FIGS. 2 and 3D, the cross-section D-D is taken along a hypothetic line between the active areas OD1 and OD2, and it can be seen that the gate electrodes WLP0, WLP1, WLR0 and WLR1 extend over the isolation region 114. In some embodiments, the gate dielectric layers 122A and 122B are disposed over the isolation region 114 rather than over the fin 105 as shown in FIG. 3A. The ILD layer 116 covers opposite sidewalls of the gate spacers 132 of the gate electrodes WLP0, WLP1, WLR0 and WLR1. Referring to the RDL 140, a conduction path is formed in which the first metallization layer further includes a conductive via 129 (i.e., the metal via VG in FIG. 2) electrically coupled to the gate electrode WLR0, and the second metallization layer further includes a conductive line Lv. The RDL 140 may further include a conductive via 149 in the third metallization layer and the source line SL0 in the fourth metallization layer. The conductive path constructed by the conductive via 129, conductive line Lv and the conductive via 149 electrically couples the source line SL0 to the gate electrode WLR0. Likewise, although not shown in the figures, the ILD layer 116 may include another conduction path to electrically couple a source line SL1 to the gate electrode WLR1.

As mentioned previously, the gate electrodes WLP0 and WLP1 of the program transistors T1 and T3 are disposed on the two ends of the fin 105. In other words, the gate electrodes WLP0 and WLP1 are arranged on opposite lateral sides or sidewalls of the active area OD0 of the bit cells 101A and 101B, respectively, and are PODE-type gate electrodes. The two-transistor (2T) structure of the memory array 10 can thus use only two FinFET devices to implement a hit cell with desired performance. In contrast, existing techniques implement the 2T structure with at least three FinFET devices because one more FinFET device is usually required to be arranged as PODE in the advanced technology nodes in which the PODE can aid in improving the performance of the non-PODE gate electrodes near the PODE while the PODE does not serve any function of a FinFET. In such situations, the PODE is merely a dummy gate electrode.

Through the proposed 2T structure, the gate electrodes WLP0 and WLP1 are arranged as program gate electrodes. The gate electrodes WLP0 and WLP1 are situated at the edges of the active areas OD1, as shown in FIGS. 2 and 3, and serve the function of improving the performance of the non-PODE, i.e., the gate electrodes WLR0 and WLR1. In the meantime, the structures of the gate electrodes WLP0 and WLP1 suffice to act as program transistors. In other words, disparate current values in the breakdown status and the insulating status of the gate dielectric layers 122A can successfully represent binary logic states '1' and '0.' As a result, the footprint of the 2T structure for a row (e.g., the first row 100 in FIG. 1) is reduced by at least 25% as compared to the existing approaches without compromising the bit cell performance.

Figure 4:
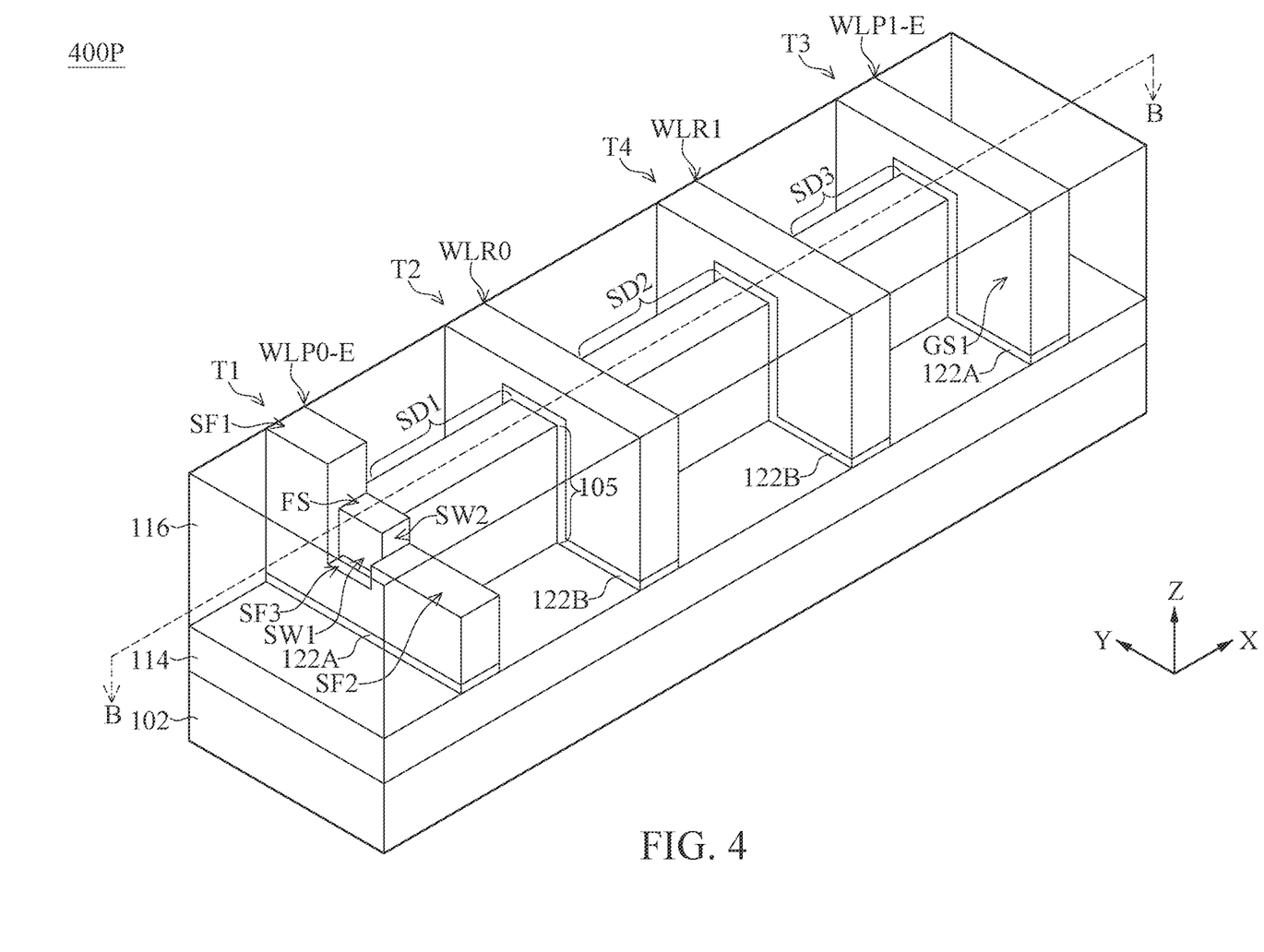
FIG. 4 is a perspective view of the memory array of FIG. 1, in accordance with some embodiments of the present disclosure.

FIG. 4 is a perspective view 400P of the memory array 10 of FIG. 1, in accordance with some embodiments of the present disclosure. The structure shown in the perspective view 400P illustrated in FIG. 4 is similar to the structure of the memory array 10 in FIG. 3A, except that the gate electrodes WLP0-E and WLP1-E of the program transistors T1 and T3 have a configuration different than that of the gate electrodes WLP0 and WLP1. The gate electrode WLP0-E is etched from the gate electrode WLP0 to form a polyhedron that may include more surfaces, vertices and edges than the original un-etched cuboid-shaped gate electrode WLP0 in FIG. 3A. Through the shaping of the non-cuboid polyhedron WLP0-E or WLP1-E, the programming performance may be enhanced by the amplified point discharge or corona discharge effect through the increased edges and vertices of the polyhedron. The programming operation can be conducted at a voltage on the gate electrode WLP0-E or WLP1-E lower than the voltage of its cuboid counterpart.

In some embodiments, the etched gate electrode WLP0-E includes a non-flat upper surface throughout the entire gate electrode WLP0-E. In some embodiments, some of the PODE-type gate electrodes may be etched while some other of the PODE-type gate electrodes may not be etched. A portion of the gate electrode WLP0-E is removed, and the upper surface of the etched gate electrode WLP0-E includes at least two different levels SF1 and SF2, in which the first level SF1 is level with the upper surface of the ILD layer 116 and the second level SF2 is lower than the first level SF1. The ILD layer 116 may cover the second level SF2.

In some embodiments, the non-flat upper surface of the gate electrode WLP0 further includes a third level SF3 between the two levels SF1 and SF2 and meeting the lateral sidewall of the fin 105. In some embodiments, the third level SF3 is substantially coplanar with or lower than the second level SF2. In some embodiments, the surface levels SF1, SF2 and SF3 may be flat or curved surfaces, such as upwardly concave or downwardly concave surfaces. In some embodiments, the surface level SF2 is formed locally around the fin 105 and the surface level away from the fin 105 is kept at the level SF1. Therefore, the contact with the conductive via 127 is kept flat and the electrical performance is not affected.

In some embodiments, the gate dielectric layer 122A remains on the fin 105 during the etching of the gate electrode WLP0-E. A first sidewall SW1 of the gate dielectric layer 122A is exposed through the etched gate electrode WLP0-E. In some embodiments, portions of a second sidewall SW2 of the gate dielectric layer 122A meeting the first sidewall SW1 are exposed through the etched gate electrode WLP0-E. At least two vertices at the upper corners of the gate dielectric layer 122A are exposed through the gate electrode WLP0-E and contact the ILD layer 116. In some embodiments, portions of an upper surface FS of the gate dielectric layer 122A meeting the first sidewall SW1 are exposed through the etched gate electrode WLP0-E. In some embodiments, trenches or recesses are formed on the upper surface levels SF1, SF2 or SF3 to generate more uneven upper surfaces of the gate electrode WLP0-E.

In some embodiments, the gate dielectric layer 122A is removed from the fin 105 during the etching of the gate electrode WLP0-E and the fin 105 is exposed. In this situation, the exposed surfaces of the fin 105 are similar to those of the un-etched gate dielectric layer 122A. The labels for the exposed surfaces of the gate dielectric layer 122A are used to indicate those of the exposed fin 105. For example, a first sidewall SW1 of the fin 105 is exposed through the etched gate electrode WLP0-E. A second sidewall SW2 of the fin 105 meeting the first sidewall SW1 is exposed through the etched gate electrode WLP0-E. An upper surface FS of the fin 105 meeting the first sidewall SW1 is exposed through the etched gate electrode WLP0-E. In some embodiments, trenches or recesses are formed on the upper surface levels SF1, SF2 or SF3 to generate more uneven upper surfaces of the gate electrode WLP0-E.

Figure 5:
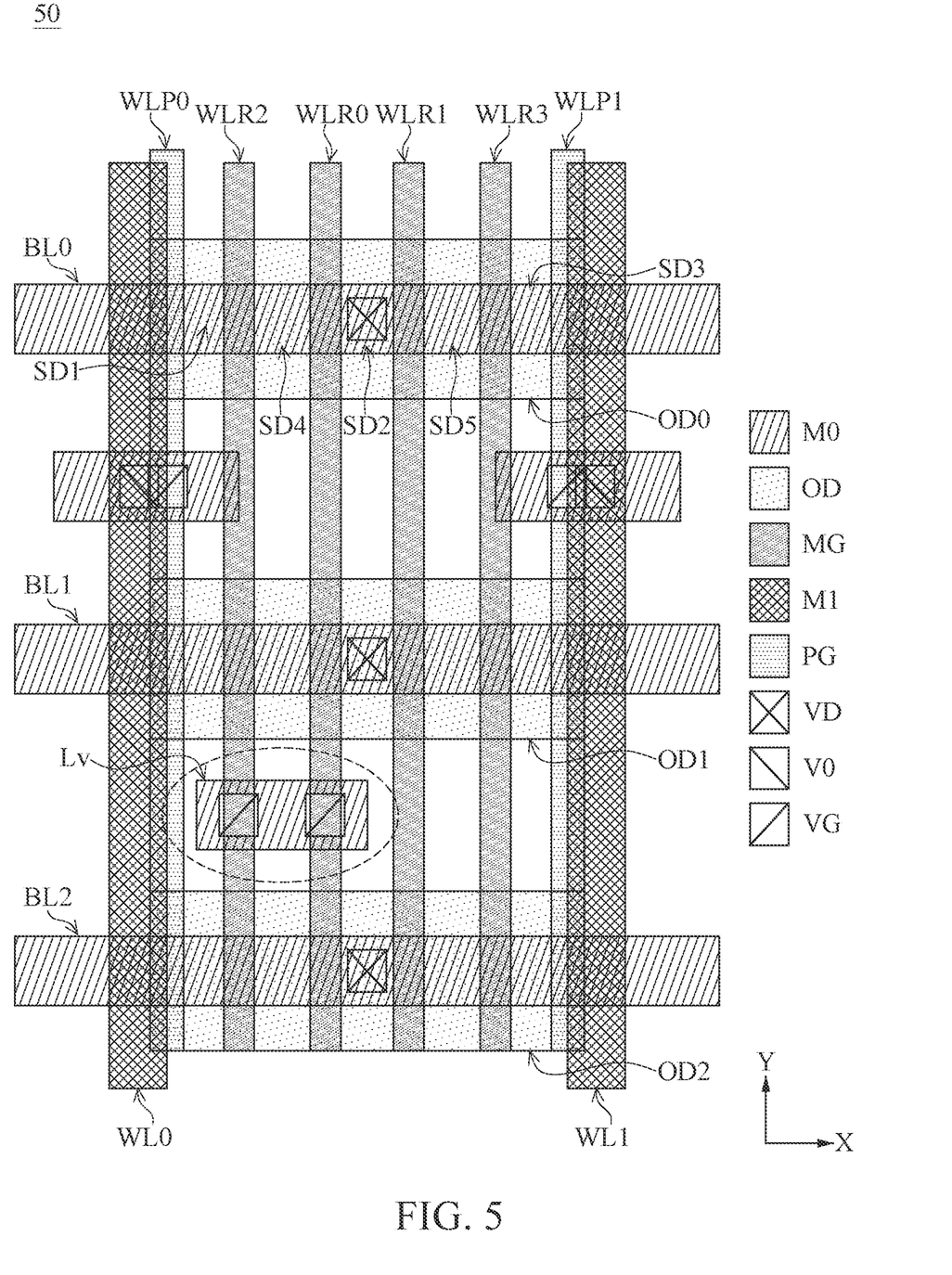
FIG. 5 is a schematic layout for a memory array, in accordance with some embodiments of the present disclosure.

The proposed PODE program transistor framework may be applied to the bit cells constructed by more than two FinFET devices. FIG. 5 is a schematic layout 50 showing a plan view of another memory array, in accordance with some embodiments of the present disclosure. The layout 50 is similar to the layout 20, except that each bit cell in the layout 50 is constructed by a program transistor and two read transistors in which the gate electrode of the additional read transistor is labeled as WLR2 or WLR3 for the first bit cell or the second bit cell. The configuration, material, and method of forming for the additional gate electrode WLR2 or WLR3, including the forming of the gate dielectric layer 122B, are similar to those of the gate electrode WLR0. In addition, the gate electrodes WLR0 or WLR2 are electrically connected to the source line SL0 through the parallel conductive vias VG that are electrically coupled to the conductive line Lv, as marked by the dashed circle. Moreover, a source/drain region SD4 (or SD5) is formed in the active area OD0 between the gate electrodes WLR0 (or WLR1) and WLR2 (or WLR3) for the first (or second) bit cell. During a programming or a read operation, the row select signal is transmitted through the source line SL0 and reaches the gate electrodes WLR0 and WLR2 of the two read transistors in the first bit cell. A conduction path is established through the channel regions of the two read transistors of the first bit cell so the programming or read operation can be successfully performed.

Figure 6:
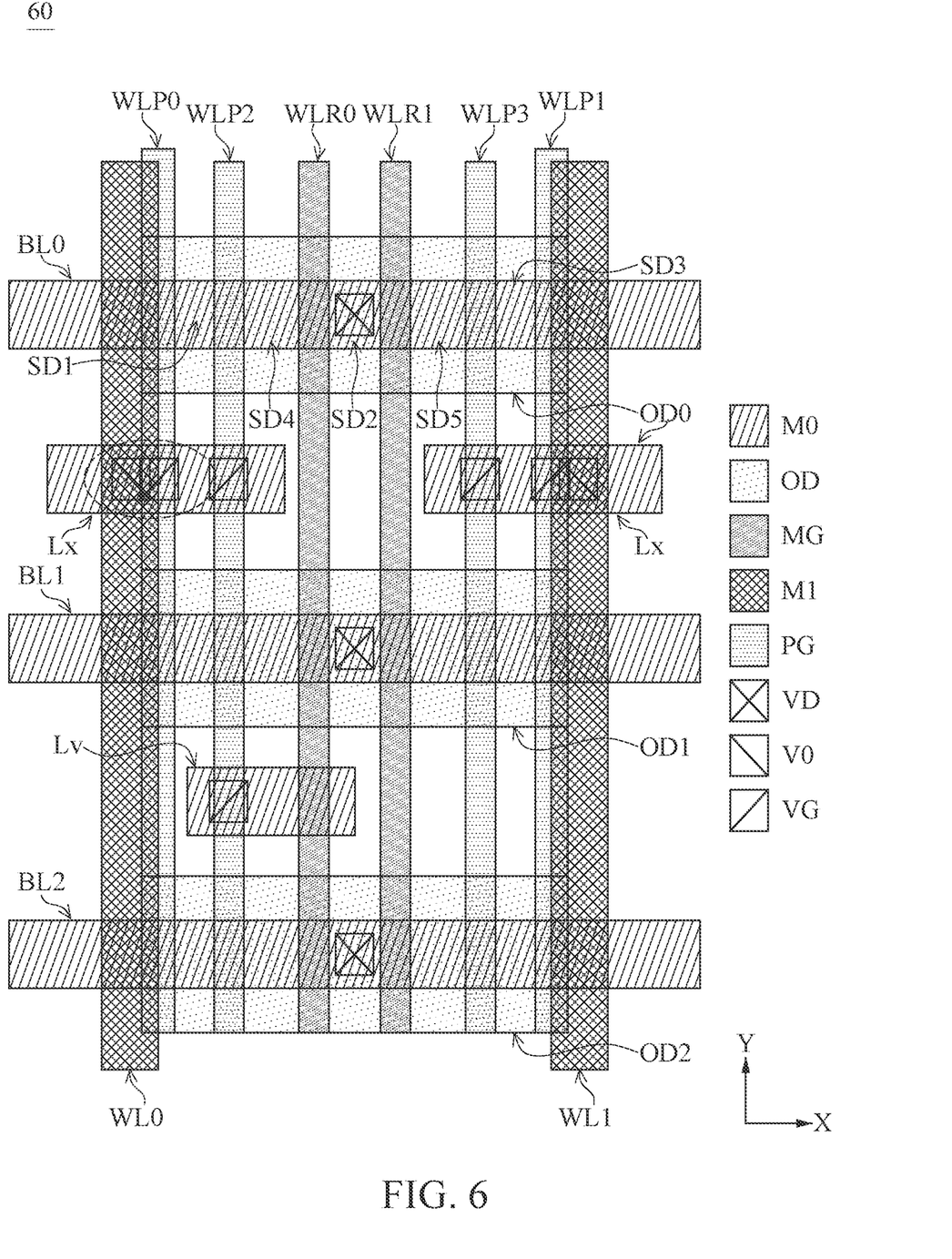
FIG. 6 is a schematic layout for a memory array, in accordance with some embodiments of the present disclosure.

FIG. 6 is a schematic layout 60 for yet another memory array, in accordance with some embodiments of the present disclosure. The layout 60 is similar to the layout 50 in that each bit cell is constructed by three FinFET devices, except that each bit cell in the layout 60 is constructed by two program transistors and one read transistor in which the gate electrode of the additional program transistor is labeled as WLP2 or WLP3 for the first bit cell or the second bit cell. The additional gate electrode WLP2 or WLP3 may not be a PODE gate electrode. The configuration, material, and method of forming for the additional gate electrode WLP2 or WLP3, including the forming of the gate dielectric layer 122A, are similar to those of the gate electrode WLP0. The gate electrodes WLP0 and WLP2 or the gate electrodes WLP1 and WLP3 are connected to the word line WL0 or WL1, respectively, through the two parallel conductive vias VG that are electrically coupled to the conductive line Lx, as marked by the dashed circles. Moreover, a source/drain region SD4 (or SD5) is formed in the active area OD0 between the gate electrodes WLR0 (or WLR1) and WLP2 (or WLP3) for the first (or second) bit cell. During a programming operation, the programming voltage is transmitted through the word line WL0 (or WL1) line and reaches both of the gate electrodes WLP0 and WLP2 (or WLP1 and WLP3) of the two program transistors in the first (or second) bit cell. A conduction path is established through at least one of the two program transistors in the first (or second) bit cell so the breakdown of the gate dielectric layers 122A can be accomplished. During a read operation, the row select signal is transmitted through the word line WL0 (or WL1) line and reaches both of the gate electrodes WLP0 and WLP2 (or WLP1 and WLP3) of the two program transistors in the first (or second) bit cell. Since at least one conduction path for the programmed bit cell is established, the read operation can be successfully conducted.

Figure 7:
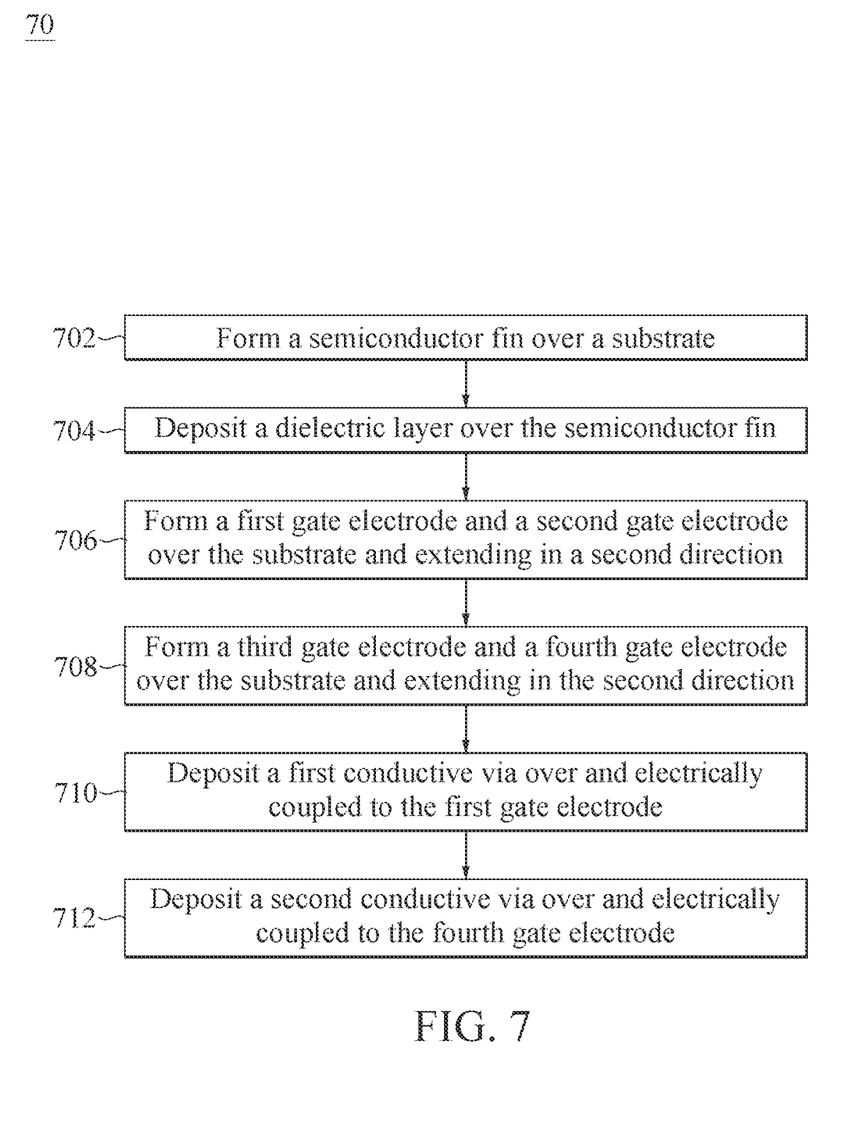
FIG. 7 is a flowchart of a method of manufacturing a memory device, in accordance with some embodiments of the present disclosure.

FIG. 7 is a flowchart of a method 70 of manufacturing a memory device, in accordance with some embodiments of the present disclosure. The memory device may include the memory array 10, and may be implemented using the layout 20, 50 and 60 as previously discussed.

At step 702, a semiconductor fin is formed over a substrate and extending in a first direction. At step 704, a dielectric layer is deposited over the semiconductor fin.

At step 706, a first gate electrode and a second gate electrode are formed over the substrate and extending in a second direction. In some embodiments, the semiconductor fin extends through the second gate electrode and terminates on the first gate electrode. In some embodiments, the first gate electrode and the second gate electrode are formed over the dielectric layer such that the dielectric layer is between the semiconductor fin and the first and second gate electrodes. In some embodiments, the first gate electrode is a PODE gate electrode.

At step 708, a third gate electrode and a fourth gate electrode are formed over the substrate and extending in the second direction. In some embodiments, the third gate electrode is between the second gate electrode and the fourth gate electrode. In some embodiments, the semiconductor fin extends through the third gate electrode and terminates on the fourth gate electrode. In some embodiments, the third gate electrode and the fourth gate electrode are formed over the dielectric layer such that the dielectric layer is between the semiconductor fin and the third and the fourth gate electrodes. In some embodiments, the fourth gate electrode is a PORE gate electrode.

At step 710, a first conductive via is deposited over and electrically coupled to the first gate electrode. In some embodiments, the first conductive via is operable to receive a first voltage to cause an electrical breakdown of the dielectric layer between the first gate electrode and the semiconductor fin.

At step 712, a second conductive via is deposited over and electrically coupled to the fourth gate electrode. In some embodiments, the second conductive via is operable to receive the first voltage to cause an electrical breakdown of the dielectric layer between the fourth gate electrode and the semiconductor fin.

En accordance with one embodiment of the present disclosure, a memory device includes a substrate, a semiconductor fin over the substrate and extending in a first direction, and a first gate electrode and a second gate electrode over the substrate and extending in a second direction. The semiconductor fin extends through the second gate electrode and terminates on the first gate electrode at one end. The memory device further includes a first conductive via over and electrically coupled to the first gate electrode. The one end of the semiconductor fin is surrounded by the first gate electrode.

In accordance with another embodiment of the present disclosure, a memory device includes a substrate and a semiconductor fin over the substrate, wherein the semiconductor fin comprises a first side and a second side opposite to the first side, and a first, a second, a third and a fourth gate electrodes over the substrate and intersecting the semiconductor fin. The second and the third gate electrodes are between the first and the second sides and the first gate electrode and the fourth gate electrode overlap the first side and the second side, respectively. The memory device further includes a first conductive via over and electrically coupled to the first gate electrode, and a second conductive via over and electrically coupled to the fourth gate electrode. The first gate electrode comprises a first sidewall and a second sidewall parallel to the first side. The first side extends between the first sidewall and the second sidewall.

In accordance with another embodiment of the present disclosure, a method of manufacturing a memory device includes: forming a semiconductor fin over a substrate and extending in a first direction, wherein the semiconductor fin includes a first sidewall and a second sidewall on two ends of the semiconductor fin; forming a first gate electrode and a second gate electrode over the substrate and extending in a second direction, wherein the semiconductor fin extends through the second gate electrode and terminates on the first gate electrode; and depositing a first conductive via over and electrically coupled to the first gate electrode. The first gate electrode covers the first sidewall from a top of the first sidewall to a bottom of the first sidewall.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A memory device, comprising:
a substrate;
a semiconductor fin over the substrate and extending in a first direction;
a first gate electrode and a second gate electrode over the substrate and extending in a second direction, the semiconductor fin extending through the second gate electrode and terminating on the first gate electrode at one end; and
a first conductive via over and electrically coupled to the first gate electrode,
wherein the one end of the semiconductor fin is surrounded by the first gate electrode,
wherein the first gate electrode comprises an upper surface having different levels.

2. The memory device of claim 1, further comprising a second conductive via electrically coupled to the second gate electrode.

3. The memory device of claim 1, further comprising a dielectric layer between the first gate electrode and the semiconductor fin, wherein the first conductive via is operable to receive a first voltage to cause an electrical breakdown of the dielectric layer.

4. The memory device of claim 3, wherein the dielectric layer covers a lateral sidewall of the semiconductor fin, wherein the lateral sidewall extends in the second direction.

5. The memory device of claim 1, further comprising an isolation region over the substrate and defining the semiconductor fin, the isolation region extending below the first gate electrode.

6. The memory device of claim 1, further comprising an inter-layer dielectric (ILD) layer over the substrate and covering an entirety of a sidewall of the first gate electrode.

7. The memory device of claim 6, wherein the ILD layer at least partially covers the upper surface of the first gate electrode.

8. The memory device of claim 6, further comprising a first source/drain region in the semiconductor fin between the first and second gate electrodes, the ILD layer covering an entirety of the first source/drain region.

9. The memory device of claim 8, further comprising:
a second source/drain region in the semiconductor fin on a side of the second gate electrode opposite the first source/drain region; and
a third conductive via over and electrically coupled to the second source/drain region.

10. The memory device of claim 1, wherein the semiconductor fin overlaps the first gate electrode by a first width, and a ratio of the first width to a second width of the first gate electrode is between about 10% and about 50%.

11. The memory device of claim 1, wherein the first gate electrode comprises polysilicon electrically coupled to the first conductive via.

12. The memory device of claim 1, wherein an entirety of the one end of the semiconductor fin is covered by the first gate electrode.

13. A memory device, comprising:
a substrate;
a semiconductor fin over the substrate, the semiconductor fin comprising a first side and a second side opposite to the first side;
a first, a second, a third and a fourth gate electrodes over the substrate and intersecting the semiconductor fin, the second and the third gate electrodes being between the first and the second sides, and the first gate electrode and the fourth gate electrode overlapping the first side and the second side, respectively;
a first, a second, a third and a fourth gate dielectric layers between the semiconductor fin and the first, second, third and fourth gate electrodes, respectively, wherein the first and fourth gate dielectric layers have a first thickness and the second and third gate dielectric layers have a second thickness, wherein a ratio between the first thickness and the second thickness is between about 70% and about 80%;
a first conductive via over and electrically coupled to the first gate electrode; and
a second conductive via over and electrically coupled to the fourth gate electrode,
wherein the first gate electrode comprises a first sidewall and a second sidewall parallel to the first side, and
wherein the first side extends between the first sidewall and the second sidewall.

14. The memory device of claim 13, wherein the first and fourth gate electrodes comprise materials different from materials of the second and the third gate electrodes.

15. The memory device of claim 13, wherein the substrate comprises a protrusion connecting to the semiconductor fin, further comprising:
an isolation region over the substrate and laterally surrounding the protrusion; and
a gate dielectric layer between the first gate electrode and the semiconductor fin, wherein the gate dielectric layer extends along a sidewall of the semiconductor fin and an upper surface of the isolation region.

16. The memory device of claim 13, wherein the first gate electrode comprises an upper surface having different levels.

17. The memory device of claim 13, further comprising:
a source/drain region in the semiconductor fin between the second and third gate electrodes; and
a third conductive via electrically coupled to the source/drain region.

18. The memory device of claim 13, further comprising a redistribution layer (RDL) over the semiconductor fin, a fifth gate electrode between the first and second gate electrodes, and a sixth gate electrode between the third and fourth gate electrodes, wherein the RDL comprises a first conductive line electrically connecting the first and the fifth gate electrodes and a second conductive line electrically connecting the fourth and the sixth gate electrodes.

19. A method of forming a memory device, comprising:
- forming a semiconductor fin over a substrate and extending in a first direction, the semiconductor fin comprising a first sidewall and a second sidewall on two ends of the semiconductor fin;
- forming a first gate electrode, a second gate electrode and a third gate electrode over the substrate and extending in a second direction, the semiconductor fin extending through the second and third gate electrodes and terminating on the first gate electrode;
- depositing a first conductive via over and electrically coupled to the first gate electrode; and
- depositing a first conductive line over the first conductive via to electrically connect the first gate electrode and the second gate electrode,
- wherein the first gate electrode covers the first sidewall from a top of the first sidewall to a bottom of the first sidewall.

20. The method of claim 19, further comprising depositing a dielectric layer between the first gate electrode and the semiconductor fin, wherein the first conductive via is operable to receive a first voltage to cause an electrical breakdown of the dielectric layer.

\* \* \* \* \*